(12) United States Patent
Sasaki

(10) Patent No.: US 10,486,739 B2
(45) Date of Patent: Nov. 26, 2019

(54) MOTOR ACTUATOR AND POWER STEERING APPARATUS USING THE SAME

(71) Applicant: HITACHI AUTOMOTIVE SYSTEMS, LTD., Hitachinaka-shi, Ibaraki (JP)

(72) Inventor: Mitsuo Sasaki, Hadano (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 16/084,705

(22) PCT Filed: Feb. 13, 2017

(86) PCT No.: PCT/JP2017/005094
§ 371 (c)(1),
(2) Date: Sep. 13, 2018

(87) PCT Pub. No.: WO2017/159160
PCT Pub. Date: Sep. 21, 2017

(65) Prior Publication Data
US 2019/0077450 A1    Mar. 14, 2019

(30) Foreign Application Priority Data
Mar. 14, 2016  (JP) .................................. 2016-049219

(51) Int. Cl.
*B62D 5/04* (2006.01)
*H02P 25/22* (2006.01)
(Continued)

(52) U.S. Cl.
CPC ........... *B62D 5/0487* (2013.01); *B60W 30/00* (2013.01); *B62D 5/0403* (2013.01);
(Continued)

(58) Field of Classification Search
CPC ................................ H02P 29/028; H02P 25/22
(Continued)

(56) References Cited

U.S. PATENT DOCUMENTS

| 8,664,901 B2 * | 3/2014 | Perisic | ................... H02P 21/18 |
| | | | 318/400.21 |
| 2011/0163708 A1 | 7/2011 | Mukai et al. | |

(Continued)

FOREIGN PATENT DOCUMENTS

| JP | 2009-254210 A | 10/2009 |
| JP | 2011-142744 A | 7/2011 |

(Continued)

*Primary Examiner* — David Luo
(74) *Attorney, Agent, or Firm* — Foley & Lardner LLP

(57) ABSTRACT

Short circuit abnormality between redundant systems with respect to motor redundant systems is detected. A motor actuator includes a first inverter circuit configured to control power supplied to a first motor stator, a second inverter circuit configured to control power supplied to a second motor stator, and a control unit portion including a calculation circuit. The control unit portion includes a first inverter control portion configured to output a control signal for controlling driving of the first inverter circuit, a second inverter control portion configured to output a control signal for controlling driving of the second inverter circuit, and a short circuit determination portion configured to, when the power is supplied only to one inverter circuit of the first inverter circuit and the second inverter circuit by the first inverter control portion or the second inverter control portion, determine presence/absence of a short circuit between the first motor stator and the second motor stator based on a conductive state of the other inverter circuit of the first inverter circuit and the second inverter circuit.

20 Claims, 14 Drawing Sheets

(51) Int. Cl.
  *H02P 27/06* (2006.01)
  *H02P 29/028* (2016.01)
  *H02P 29/032* (2016.01)
  *B60W 30/00* (2006.01)
  *H02P 6/04* (2016.01)
  *H02P 29/024* (2016.01)
  *G01R 31/02* (2006.01)

(52) U.S. Cl.
  CPC .............. *B62D 5/0484* (2013.01); *H02P 6/04* (2013.01); *H02P 25/22* (2013.01); *H02P 27/06* (2013.01); *H02P 29/028* (2013.01); *H02P 29/0241* (2016.02); *H02P 29/032* (2016.02); *G01R 31/025* (2013.01)

(58) Field of Classification Search
  USPC .................................................. 318/490, 560
  See application file for complete search history.

(56) References Cited

U.S. PATENT DOCUMENTS

| | | |
|---|---|---|
| 2014/0097776 A1 | 4/2014 | Hayashi |
| 2014/0253006 A1 | 9/2014 | Satou et al. |
| 2017/0033725 A1 | 2/2017 | Koseki et al. |

FOREIGN PATENT DOCUMENTS

| | | |
|---|---|---|
| JP | 2014-79045 A | 5/2014 |
| JP | 2014-176229 A | 9/2014 |
| JP | 2015-177620 A | 10/2015 |
| JP | 2015-202019 A | 11/2015 |

\* cited by examiner

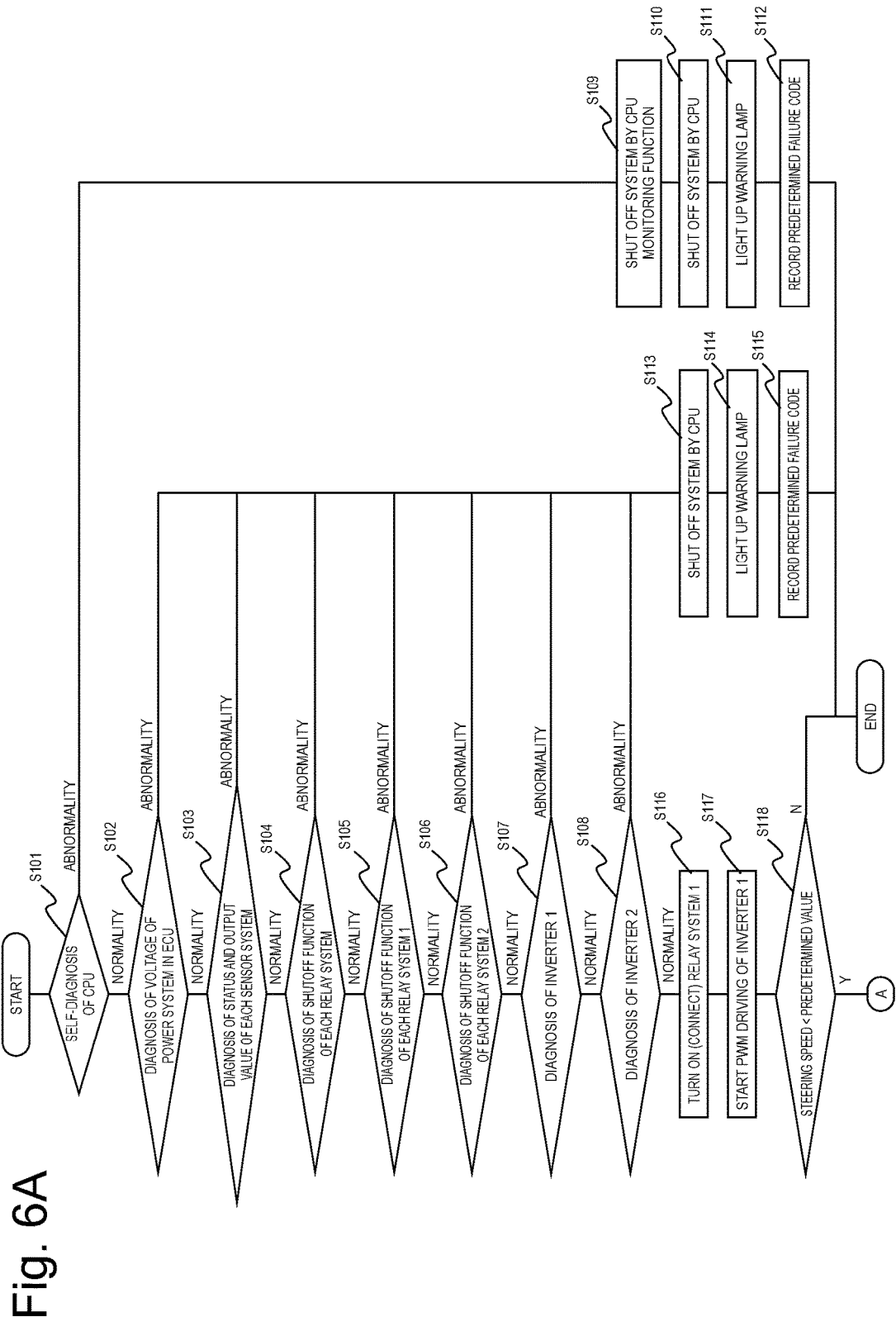

MOTOR ACTUATOR AND POWER STEERING APPARATUS USING THE SAME

TECHNICAL FIELD

The present invention relates to a power steering apparatus, and, in particular, to control of a motor actuator for use in the power steering apparatus.

BACKGROUND ART

In recent years, widespread use of electric power steering apparatuses (hereinafter referred to as EPSs (Electric Power Steerings)) has being leading to a demand for further improvement of product appeal. Under these circumstances, regarding sustainability of an assist function at the time of a system failure, there has been a demand desiring provision of the function so earnestly that even the function with a time limit imposed thereon would be acceptable. One solution for meeting this demand is an EPS including redundant inverter systems and motor systems and backing up control with use of only one of the systems when a failure has occurred therein, and this EPS also has been starting to be brought to the market.

Japanese Patent Application Public Disclosure No. 2011-142744 (PTL1) discusses one background art in the present technical field. PTL 1 discloses a motor drive apparatus directed to an object of providing a motor drive apparatus capable of controlling a motor appropriately even in a period immediately after starting a motor drive operation. This motor drive apparatus includes a plurality of motor drive parts from first to n-th motor drive parts (n is a natural number equal to or greater than 2), each of the motor drive parts including a winding set corresponding to a plurality of phases and configured to drive a motor and an inverter for supplying a current to the winding set, and a control unit configured to check whether a failure is present with respect to each of the motor drive parts from the first to n-th motor drive parts and control current supply to the winding set through the inverter in each of the motor drive parts. The control unit can execute a series of "m" failure detection processing procedures (m is a natural number) with respect to each of the first to n-th motor drive parts. The control unit is configured to start the current supply to each of the winding sets of the first to n-th motor drive parts after completion of all of the m failure detection processing procedures executed with respect to each of the first to n-th motor drive parts.

CITATION LIST

Patent Literature

PTL 1: Japanese Patent Application Public Disclosure No. 2011-142744

SUMMARY OF INVENTION

Technical Problem

PTL 1 discusses an initial diagnosis method of an EPS including two drive systems and two motor coil systems, and the motor drive apparatus starts driving the two motor systems simultaneously after all of the diagnoses of the drive circuits confirm normality. PTL 1 states that, according to this method, the two motor systems are driven simultaneously after all of the initial diagnoses determine the normality, so that the assist can be started without causing a driver to feel that a steering wheel is stiff to turn or feel discomfort at an initial stage of the start. However, PTL 1 fails to mention detection of abnormality when coils of the two motor systems have a short circuit (a short-circuiting) between these systems, thereby raising a possibility that the currents to the motors may lose balance and the steering wheel may be vibrated when the motors are driven.

The present invention relates to a technique for detecting the short-circuit abnormality between the redundant systems that occurs between these redundant motor systems.

Solution to Problem

According to one aspect of the present invention, a motor actuator is provided. This motor actuator includes a housing rotatably supporting a rotational shaft, a first motor stator provided in the housing and including a metallic wiring, a second motor stator provided in the housing and including a metallic wiring, a motor rotor provided in the housing and configured to rotate together with the rotational shaft, a first inverter circuit configured to control power supplied to the first motor stator, a second inverter circuit configured to control power supplied to the second motor stator, and a control unit portion including a calculation circuit. The control unit portion includes a first inverter control portion configured to output a control signal for controlling driving of the first inverter circuit, a second inverter control portion configured to output a control signal for controlling driving of the second inverter circuit, and a short circuit determination portion configured to, when the power is supplied only to one inverter circuit of the first inverter circuit and the second inverter circuit by the first inverter control portion or the second inverter control portion, determine presence/absence of a short circuit between the first motor stator and the second motor stator based on a conductive state of the other inverter circuit of the first inverter circuit and the second inverter circuit.

According to the aspect of the present invention, the present invention can provide a motor actuator capable of, when the short circuit failure has occurred between the motors in the redundant systems, detecting this abnormality quickly and issuing a warning to the driver appropriately, and also shifting to an optimum system state. The present invention can also provide a power steering apparatus using this motor actuator.

BRIEF DESCRIPTION OF DRAWINGS

FIG. 6A is a first half portion of a processing flowchart of the abnormality detection mechanism by the three-phase voltage monitor illustrated in FIG. 4 in the diagnosis sequence illustrated in FIG. 3(A) according to the first embodiment.

DESCRIPTION OF EMBODIMENTS

In the following description, embodiments of the present invention will be described with reference to the drawings.

First Embodiment

Figure 1:
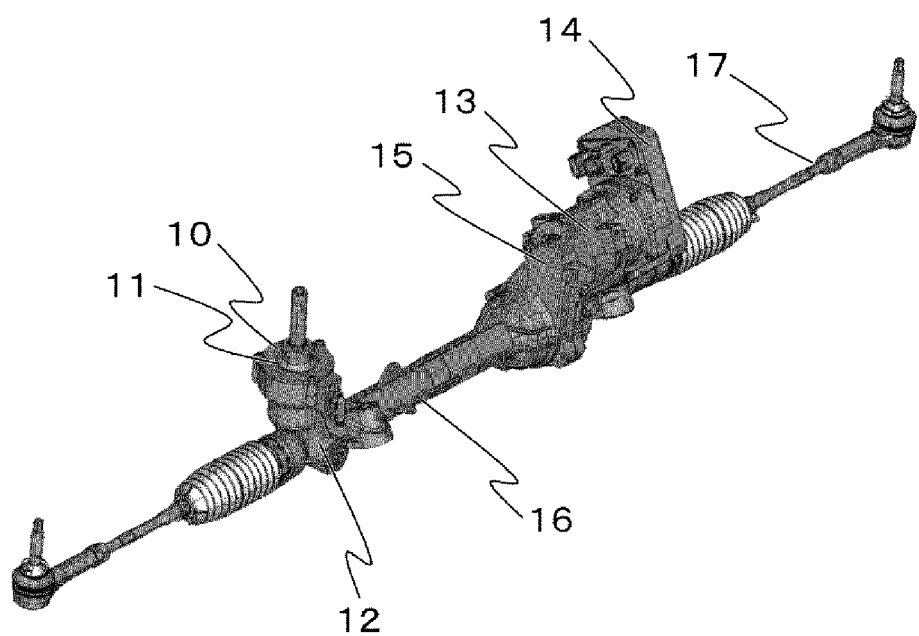
FIG. 1 is a configuration diagram of an EPS system that illustrates main units forming an EPS according to a first embodiment.

FIG. 1 is a configuration diagram of an EPS system that illustrates main units forming an EPS according to a first embodiment. In FIG. 1, reference numerals 10 and 11 denote a steering torque sensor and a steering angle sensor, respectively. A connected steering shaft is rotated according to a rotation of a not-illustrated steering wheel, and the steering torque sensor 10 and the steering angle sensor 11 detect a steering torque and a rotational angle thereof, respectively. Reference numeral 12 denotes a rack and pinion gear, 13 denotes a motor, 14 denotes an ECU (Electronic Control Unit), 15 denotes a speed reducer that amplifies a torque of the motor and converts a force in a rotational direction into a force in a direction along a rack shaft, 16 denotes a rack housing, and 17 denotes a tie rod. A not-illustrated pair of tires is coupled to both ends of the rack shaft via the tie rods and the like, respectively. By this configuration, when a driver rotates the steering wheel, a rotational motion of the steering shaft is converted into a linear motion of the rack shaft by the rack and pinion gear 12, and the pair of tires is turned by an angle corresponding to a displacement of the linear motion of the rack shaft. Further, the speed reducer 15 is rotated in a normal/opposite direction by the motor 13 that generates an assist steering torque, by which a force according to a steering direction and a steering torque of the steering wheel is converted into the liner motion of the rack shaft, serving as assist steering for turning the tires. Hereinafter, the motor 13 and the ECU 14 will be collectively referred to as a motor actuator.

Figure 2:
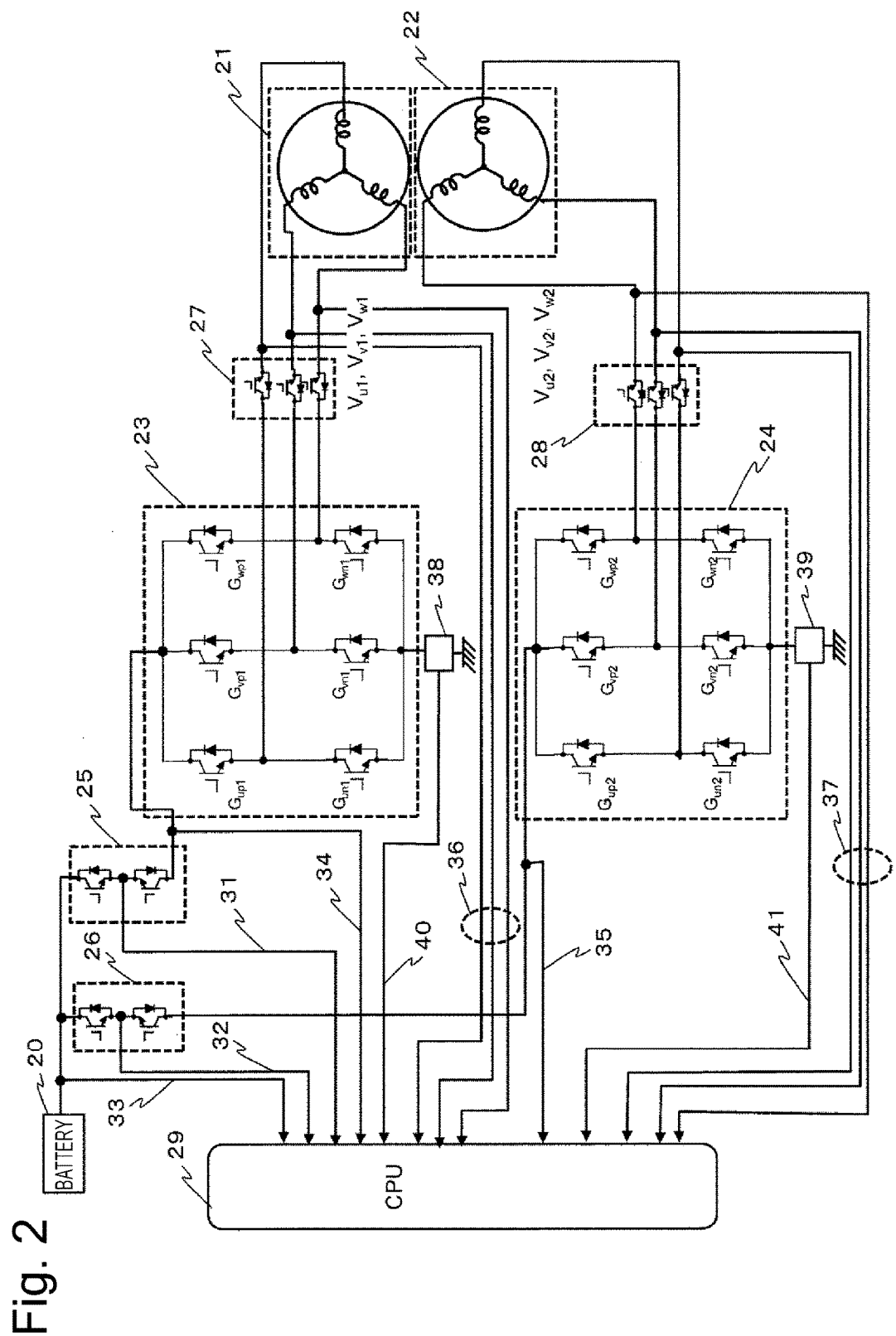
FIG. 2 is a block configuration diagram of a motor and an ECU in a case where one CPU and two inverters and motors are used with respect to the EPS system according to the first embodiment.

FIG. 2 is a block configuration diagram of the motor and the ECU in a case where the EPS system is formed by one CPU and two inverters and motors with respect to the EPS system according to the present embodiment.

In FIG. 2, the motor includes a housing, a first motor stator, a second motor stator, and a motor rotor. The housing rotatably supports a rotational shaft. The first motor stator is provided in the housing, and includes a metallic winding. The second motor stator is provided in the housing, and includes a metallic winding. The motor rotor is provided in the housing, and rotates together with the rotational shaft. In other words, the motor includes a winding coil 1 (21) and a winding coil 2 (22) constituted by two pairs of star connections or delta connections in one casing, and forms each phase. Hereinafter, these winding coils will be referred to as the motor 1 (21) and the motor 2 (22), respectively. Then, the ECU includes an inverter 1 (23) and an inverter 2 (24), which are a pair of motor drive circuits corresponding to these motors, and controls current supply to each phase of the motor 1 (21) and the motor 2 (22). The inverter 1 (23) and the inverter 2 (24) are formed by a plurality of drive elements (FETs). Then, driving of the inverter 1 (23) and the inverter 2 (24) is controlled by a CPU 29. Further, the ECU is configured to include a pair of fail-safe (FS) relay 1 (25) and fail-safe (FS) relay 2 (26) that switches the current supply from a battery 20 between a conductive state and a shutoff state, and also set, for each phase of each pair, a pair of motor relay 1 (27) and motor relay 2 (28) that creates the conductive state and the shutoff state between each phase of the motor windings of the motor 1 (21) and the motor 2 (22) and the inverter 1 (23) and the inverter 2 (24).

The CPU 29 in the ECU introduces the following determination information and detects abnormality. The determination information includes two FS relay intermediate voltage monitor 1 (31) and FS relay intermediate voltage monitor 2 (32), a battery voltage monitor 33 capable of monitoring a voltage of the battery, and a pair of inverter 1 upstream voltage monitor (34) and inverter 2 upstream voltage monitor (35) each of which measures a voltage on an upstream portion of an upper arm (upstream)-side drive element of each of the inverters, and further includes a pair of three-phase voltage monitor 1 (36) and three-phase voltage monitor 2 (37), a motor current sensor 1 (38) and a motor current sensor 2 (39) for measuring a current flowing in each of the one pair of motors, i.e., a direct-current bus current of each of the inverters, and a motor 1 current monitor (40) and a motor 2 current monitor (41) that measure an output of each of them.

The FS relay intermediate voltage monitor is a configuration required in a case where a semiconductor-type relay is employed as each of the FS relay 1 (25) and the FS relay 2 (26), and usable to avoid a failure to shut off the power source due to a parasitic diode located in the semiconductor, and the parasitic diode is arranged so as to be oriented outward between the two semiconductor relays. This monitor is omitted in a case where a mechanical-type relay is employed as the FS relay.

Figure 3:
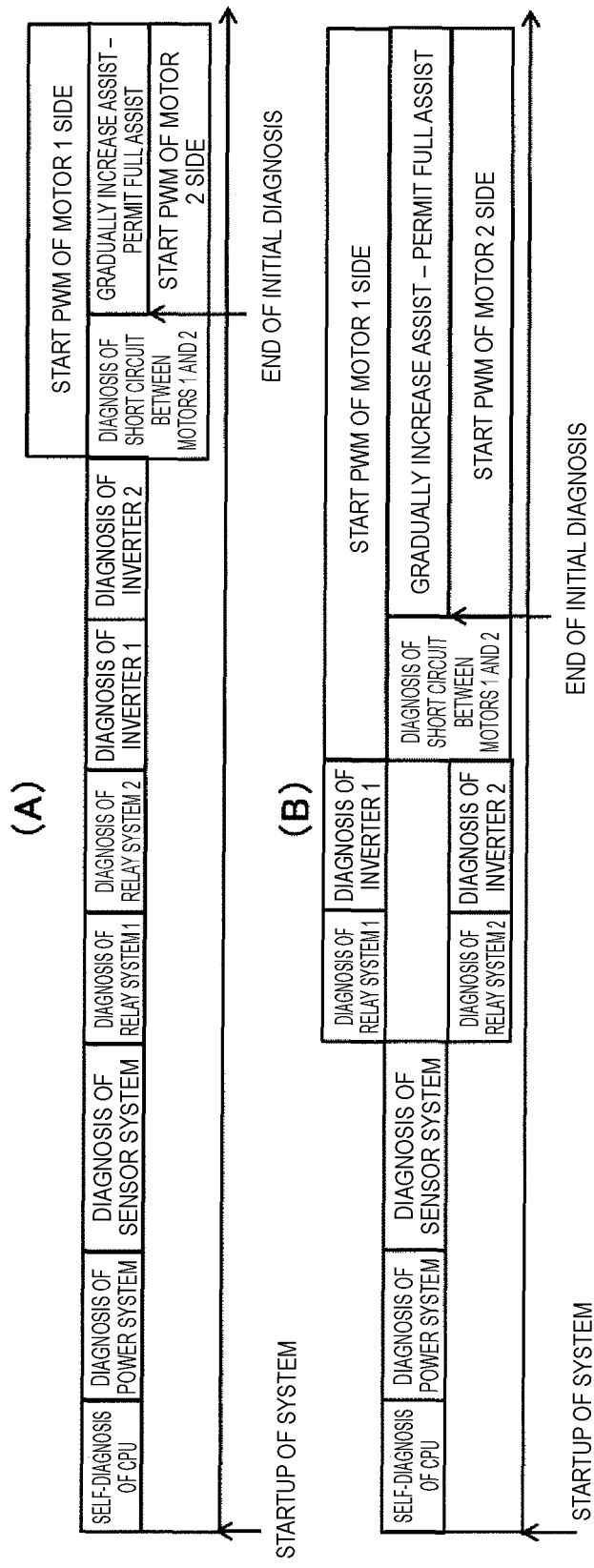
FIG. 3 is a timing configuration diagram illustrating a diagnosis sequence from a startup of the system to a start of full-assist control according to the first embodiment.

FIG. 3 is a timing configuration diagram illustrating a diagnosis sequence from a startup of the system to a start of full-assist control according to the first embodiment. Horizontal axes in FIG. 3 represent time, and FIG. 3 illustrates three diagnosis sequence examples. FIG. 3(A) illustrates the diagnosis sequence when each diagnosis is carried out in series in the case of the system including one CPU and two inverters and motors illustrated in FIG. 2. More specifically, when the system is started up, first, the ECU carries out a self-diagnosis of the CPU, and, subsequently, carries out a diagnosis of the power source system, a diagnosis of the sensor system, diagnoses of the relay systems 1 and 2, and diagnoses of the inverters 1 and 2 in series. After that, the ECU carries out a diagnosis of a short circuit between the motors 1 and 2. Although the diagnosis of the short circuit will be described in detail below, at the time of the diagnosis of the short circuit, first, the ECU starts PWM driving of the motor 1 by the inverter 1 on the motor 1 side while refraining from driving the inverter 2 on the motor 2 side. This operation causes an increase in the voltage of the three-phase voltage monitor on the motor 2 side if the short circuit has occurred between the coils, and therefore the ECU can detect the short circuit.

Upon completion of the diagnosis of the short circuit between the motors 1 and 2 by this processing, an initial diagnosis is ended. Now, the ECU includes a supply power limit portion that performs limiter processing for limiting an upper limit value of an amount of the power supply to the motor, and carries out the diagnosis of the short circuit by completing the diagnosis of the short circuit during execution with the upper limit value set to 0 in the limiter processing, i.e., no assist provided. Then, after the end of the diagnosis of the short circuit, the ECU starts PWM driving of the motor 2 by the inverter 2 on the motor 2 side to gradually increase the assist of the EPS system, thereby starting the full-assist control. As a result of this sequence, the diagnosis of the short circuit is already ended in a state ready for full power supply after the power limit portion ends the limiter processing, so that the ECU can perform appropriate motor control in the state ready for the full power supply.

In the diagnosis sequence illustrated in FIG. 3(A), if starting the PWM driving of the motor 2 by the inverter 2 after a predetermined time period has elapsed since the inverter 1 starts the PWM driving of the motor 1, the ECU carries out the diagnosis of the short circuit between the motors 1 and 2 during this predetermined time period. In other words, if performing the PWM driving control of the motors 1 and 2 by the inverters 1 and 2 while inserting a time lag therebetween, the ECU can carry out the diagnosis of the short circuit between the motors 1 and 2 during this time lag.

Further, because the power supply to the motors 1 and 2 is started after the diagnoses of the inverters 1 and 2 are carried out, this sequence allows the apparatus to improve safety thereof.

FIG. 3(B) illustrates the diagnosis sequence when the diagnoses of the relays 1 and 2 are carried out in parallel and the diagnoses of the inverters 1 and 2 are also carried out in parallel in the case of the system including one CPU and two inverters and motors illustrated in FIG. 2. This sequence allows presence or absence of the short circuit to be determined in a short time period compared to the sequence illustrated in FIG. 3(A).

Figure 4:
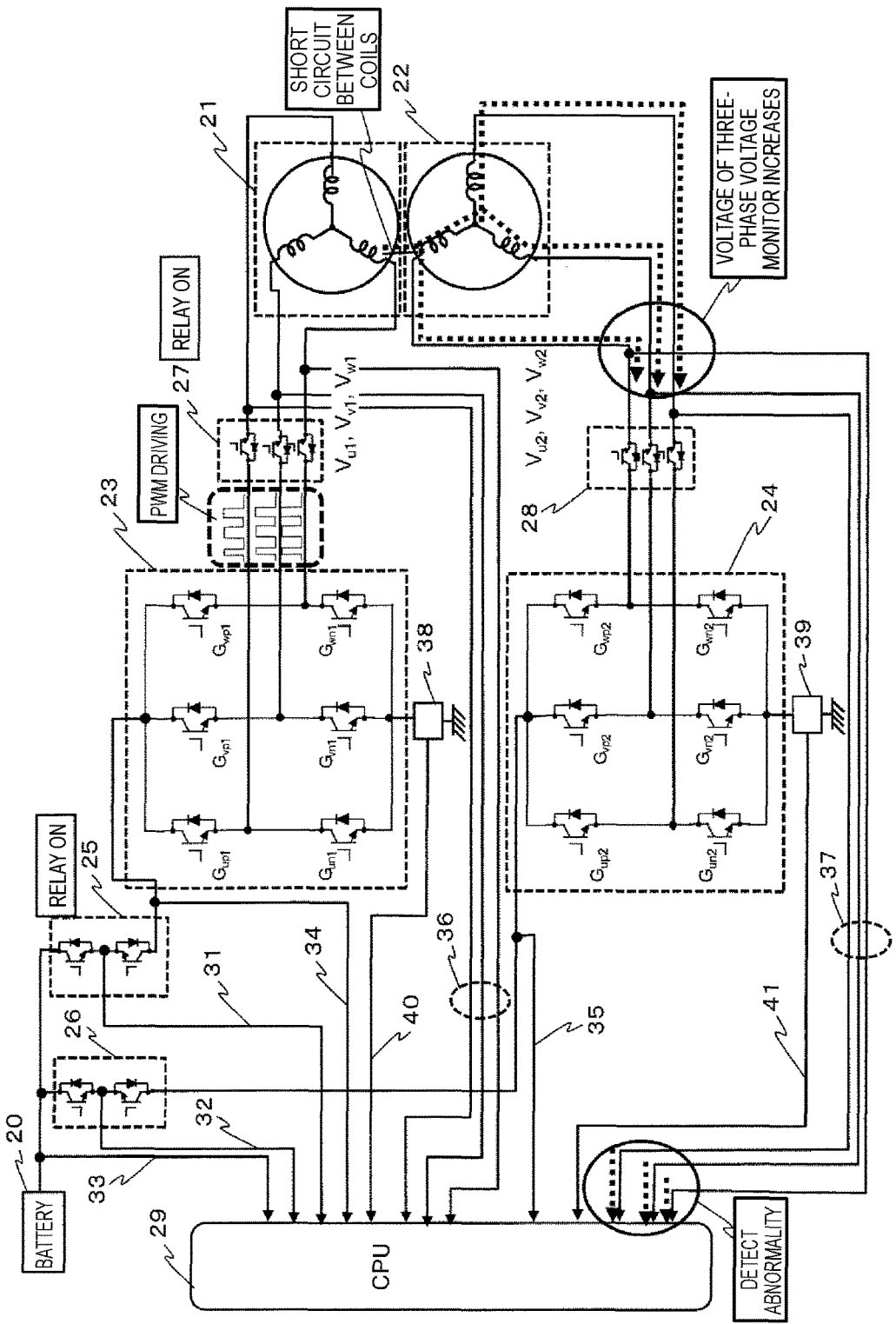
FIG. 4 is a block configuration diagram of the motor and the ECU that illustrates an abnormality detection mechanism by a three-phase voltage monitor according to the first embodiment.

FIG. 4 is a block configuration diagram of the motor and the ECU that illustrates an abnormality detection mechanism by the three-phase voltage monitor according to the present embodiment. In FIG. 4, when carrying out the diagnosis of the short circuit between the motors, first, the ECU turns on the FS relay 1 (25) to set the current supply from the battery 20 to the inverter 1 (23) into the conductive state, and turns on the motor relay 1 (27), thereby starting the PWM driving of the motor 1 by the inverter 1 (23) under the inverter control by the CPU 29.

On the other hand, the ECU keeps the FS relay 2 (26) turned off, thereby maintaining a state in which no current is supplied to the inverter 2 (24). Further, the ECU also turns off the motor relay 2 (28). The ECU turns off them in this manner because being able to appropriately determine the presence/absence of the short circuit due to no voltage applied from the inverter 2 to a power supply phase of the motor 2.

Then, if the motor actuator operates normally without the short circuit occurring between the motors, no voltage is generated on the three-phase voltage monitor 2 (37) on the motor 2 side. However, if the short circuit has occurred between the motors, power is also supplied to the motor 2 side, and therefore the voltage of the three-phase voltage monitor 2 (37) increases. Therefore, the ECU can carry out the diagnosis of the short circuit between the motors by observing this three-phase voltage monitor 2 (37). More specifically, the motors 1 and 2 each include a plurality of power supply phases. Therefore, the ECU performs control so as to cause the inverters 1 and 2 to selectively supply power to the plurality of power supply phases. By this control, when power is supplied only to the selected phase on one of the motors, no conduction occurs on the other of the motors if the motor actuator operates normally but conduction and thus the power supply state are also established on the other of the motors if the short circuit has occurred between the motors. The ECU can determine the presence/absence of the short circuit between the motors by detecting this conductive state by the three-phase voltage monitor.

In this manner, when only one of the inverters controls the driving of only one of the motors, the ECU can determine the presence/absence of the short circuit between the motors when the voltage value is detected from the three-phase voltage monitor from the other of the motors, i.e., by detecting that the motor actuator is in such a state that power is also supplied to the other of the motors.

In the present embodiment, the motor actuator has been described referring to the example including the two motors and inverters, but may include more motors and/or inverters.

Further, the inverters 1 and 2 may be provided in a same processor core or may be provided in different processor cores.

Further, the motor actuator has been described assuming that the abnormality detection is carried out by software processing performed by the CPU, but the abnormality detection may be realized by hardware.

Figure 5:
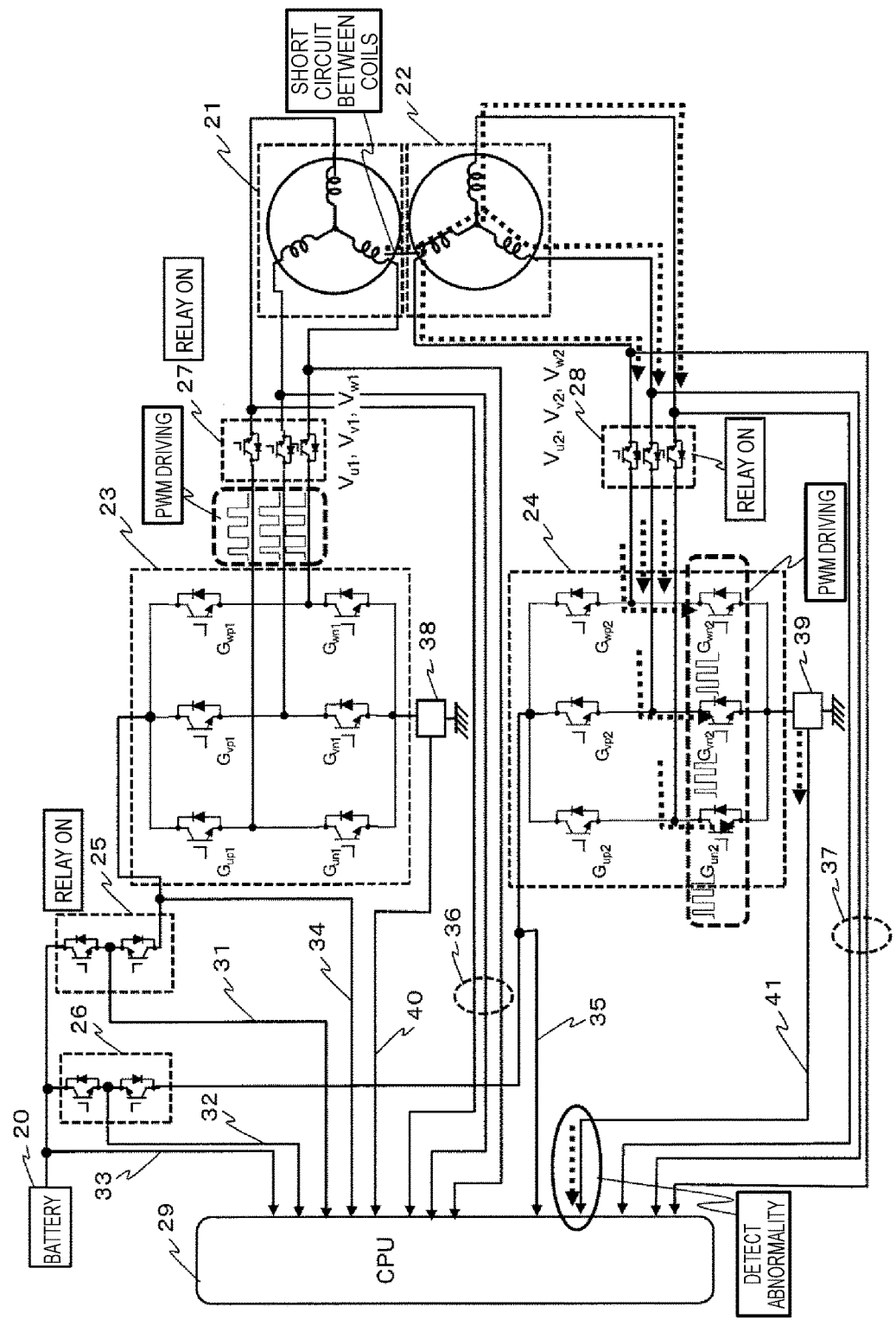
FIG. 5 is a block configuration diagram of the motor and the ECU that illustrates an abnormality detection mechanism by a motor current monitor according to the first embodiment.

FIG. 5 is a block configuration diagram of the motor and the ECU that illustrates an abnormality detection mechanism by the motor current monitor according to the present embodiment. In FIG. 5, when carrying out the diagnosis of the short circuit between the motors, first, the ECU turns on the FS relay 1 (25) to set the current supply from the battery 20 to the inverter 1 (23) into the conductive state, and turns on the motor relay 1 (27), thereby starting the PWM driving of the motor 1 by the inverter 1 (23). On the other hand, the ECU turns on the motor relay 2 (28). At this time, if the motor actuator operates normally without the short circuit occurring between the motors, the motor 2 is not driven by the inverter 2 (24) and therefore no current is detected by the motor 2 current monitor 41. On the other hand, if the short circuit has occurred between the motors, the current also flows on the motor 2 side, and is detected by the motor current sensor 2 (39) by driving a lower arm (downstream)-side drive element on the inverter 2 (24) side by the PWM. Then, the current of the motor 2 current monitor 41 increases. Therefore, the ECU can carry out the diagnosis of the short circuit between the motors by observing this motor 2 current monitor 41.

In sum, the inverter 1 and the inverter 2 each include the drive elements configured to control the power supply to the plurality of power supply phases that the motors 1 and 2 each include. These drive elements include the upstream-side drive element and the downstream-side drive element for each of the plurality of power supply phases. The inverter 1 and the inverter 2 each form the bridge circuit. The drive elements control the switching of the power supply states of the plurality of power supply phases by switching the ON states and OFF states of the upstream-side and downstream-side drive elements. When the downstream-side drive element of the other of the inverter 1 and the inverter 2 is in the ON state, the ECU determines the presence/absence of the short circuit between the motors based on the result of the detection by one of the motor current sensor 1 (38) and the motor current sensor 2 (39) that detects the direct-current bus current of the other of the inverters.

Figure 6B:
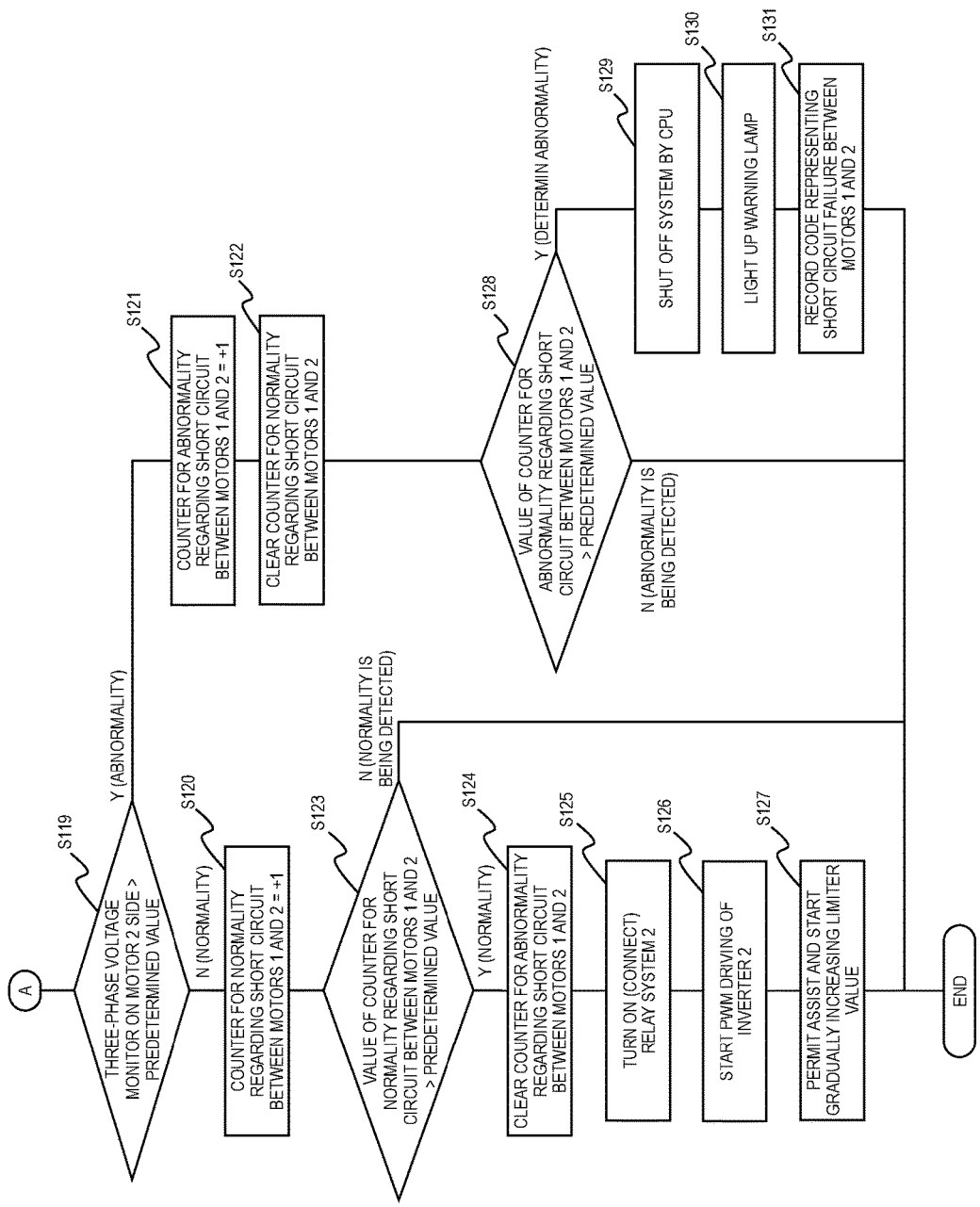
FIG. 6B is a second half portion of the processing flowchart of the abnormality detection mechanism by the three-phase voltage monitor illustrated in FIG. 4 in the diagnosis sequence illustrated in FIG. 3(A) according to the first embodiment.

FIGS. 6A and 6B are a processing flowchart of the abnormality detection mechanism by the three-phase voltage monitor illustrated in FIG. 4 in the diagnosis sequence illustrated in FIG. 3(A) according to the present embodiment. As seen from FIGS. 6A and 6B, this flowchart is divided into FIGS. 6A and 6B due to space limitation on the paper, but is continuous via an alphabet A. In FIG. 6A, in steps of S101 to S108, the ECU carries out the self-diagnosis of the CPU, the diagnosis of the power source system, the diagnosis of the sensor system, the diagnoses of the relay systems 1 and 2, and the diagnoses of inverters 1 and 2 in series, as described with reference to FIG. 3(A).

If the self-diagnosis of the CPU indicates abnormality, the ECU shuts down the system by a CPU monitoring function in S109 and also shuts down the system by the CPU in S110 redundantly. This is because the system may be unable to be shut down by itself depending on a failed portion of the CPU. After that, the ECU lights up a warning lamp (S111) and records a predetermined failure code (S112), and then ends the processing.

If any of the diagnoses in steps of S102 to S108 indicate abnormality, in S113, the ECU shuts down the system by the CPU. After that, the ECU lights up the warning lamp (S114) and records a predetermined failure code (S115), and then ends the processing.

If all the diagnoses in steps of S101 to S108 indicate normality, the ECU turns on the FS relay 1 (25) to set the current supply from the battery 20 to the inverter 1 (23) into the conductive state and turns on the motor relay 1 (27) in S116, and starts the PWM driving of the motor 1 by the inverter 1 (23) in S117, as described with reference to FIG. 4. On the other hand, the ECU keeps the FS relay 2 (26) turned off, thereby maintaining the state in which no current is supplied to the inverter 2 (24). Further, the ECU also turns off the motor relay 2 (28). Next, in S118, the ECU determine whether a steering speed is lower than a predetermined value. The ECU checks the steering speed at this time so as to be able to monitor the voltage when the motor is approximately stopped with the aim of improving monitoring accuracy, because a surge voltage occurs when the motor rotates. Therefore, if the steering speed is higher than the predetermined value, the ECU ends the processing.

If the steering speed is lower than the predetermined value, in S119, the ECU determines whether the three-phase voltage monitor 2 (37) on the monitor 2 side exceeds a predetermined value. If the three-phase voltage monitor 2 (37) on the monitor 2 side is higher than the predetermined value, the ECU determines that the short circuit has occurred between the motors. Then, in S121, the ECU increments a counter for the abnormality regarding the short circuit between the motors 1 and 2 by one. In S122, the ECU clears a counter for the normality regarding the short circuit between the motors 1 and 2. After that, in S128, the ECU determines whether a value of the counter for the abnormality regarding the short circuit between the motors 1 and 2 exceeds a predetermined value. If this counter value exceeds the predetermined value, in S129, the ECU shuts down the system by the CPU. After that, the ECU lights up the warning lamp (S130) and records a code indicating the short circuit failure between the motors 1 and 2 (S131), and then ends the processing. If the value of the counter for the abnormality regarding the short circuit between the motors 1 and 2 does not exceed the predetermined value in S128, the ECU ends the processing assuming that the abnormality is being detected.

If the three-phase voltage monitor 2 (37) on the monitor 2 side does not exceed the predetermined value in S119, the ECU determines the normality. Then, in S120, the ECU increments the counter for the normality regarding the short circuit between the motors 1 and 2 by one. Then, the ECU determines whether a value of the counter for the normality regarding the short circuit between the motors 1 and 2 exceeds a predetermined value. If this counter value does not exceed the predetermined value, the ECU ends the processing assuming that the normality is being detected. On the other hand, if this counter value exceeds the predetermined value, the ECU determines the normality. Then, in S124, the ECU clears the counter for the abnormality regarding the short circuit between the motors 1 and 2. Then, the diagnosis of the short circuit is ended. After that, the ECU turns on the relay system 2 in S125, starts the PWM driving of the motor 2 by the inverter 2 on the motor 2 side in S126, and permits the assist of the EPS system and gradually increases the limit value of the limiter processing to thus start gradually increasing the assist in S127.

In this manner, during the PWM driving of one of the systems, the ECU can detect the short circuit between the motor systems with use of the three-phase voltage monitor on the other system side.

Figure 7:
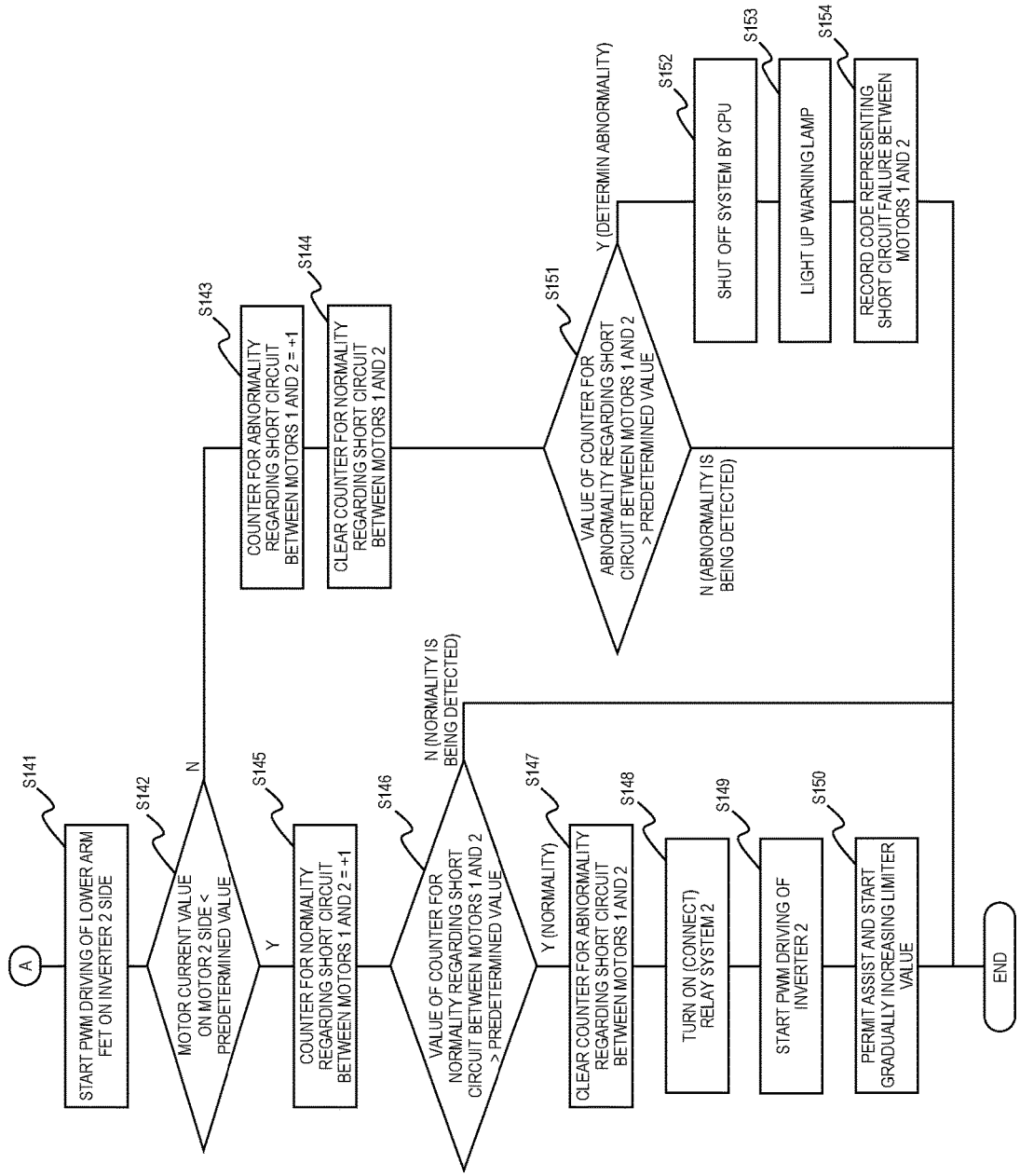
FIG. 7 is a second half portion of a processing flowchart of the abnormality detection mechanism by the motor current monitor illustrated in FIG. 5 in the diagnosis sequence illustrated in FIG. 3(A) according to the first embodiment.

FIG. 7 is a second half portion of a processing flowchart of the abnormality detection mechanism by the motor current monitor illustrated in FIG. 5 in the diagnosis sequence illustrated in FIG. 3(A) according to the present embodiment. FIG. 7 illustrates a flow indicating processing after the alphabet A when the steering speed is determined to be lower than the predetermined value as a result of determining whether the steering speed is lower than the predetermined value in S118 illustrated in FIG. 6A. This flow proceeds in a similar manner to FIG. 6A before the alphabet A and therefore a description thereof will be omitted here.

In FIG. 7, in S141, the ECU starts the PWM driving of the lower arm-side drive element on the inverter 2 side. Then, in S142, the ECU determines whether the motor current value on the motor 2 side is higher than a predetermined value. If this value is higher than the predetermined value, the ECU determines that the short circuit has occurred between the motors. Then, the processing proceeds to S143, S144, and S151 to S154. These steps are performed in a similar manner to S121, S122, and S128 to S131 illustrated in FIG. 6B, and therefore descriptions thereof will be omitted here. On the other hand, if the motor current value on the monitor 2 side does not exceed the predetermined value in S142, the ECU determines the normality. Then, the processing proceeds to S145 to S150. These steps are performed in a similar manner to S120 and S123 to S127 illustrated in FIG. 6B, and therefore descriptions thereof will be omitted here.

When the current sensor is used for the detection, it is desirable to drive the PWM driving of the lower arm-side drive element of the inverter in the system on the detection side at an extremely small Duty so as to prevent occurrence of an excessive current due to the short circuit between the motor systems. In other words, it is possible to prevent or reduce damage inflicted on the inverter due to supply of the excessive current to the other of the inverters by operating so as to determine the presence/absence of the short circuit when a PWM duty value of the other of the inverters is lower than a PWM duty value of one of the inverters.

In this manner, during the PWM driving of one of the systems, the ECU can detect the short circuit between the motor systems by detecting the conductive state on the other system side based on the monitor value of the motor current sensor. By this configuration, the ECU can improve accuracy of determining the short circuit by detecting an extremely low current with use of the motor current sensor.

In this manner, the present embodiment is the motor actuator, and is configured to include the housing rotatably supporting the rotational shaft, the first motor stator provided in the housing and including the metallic wiring, the second motor stator provided in the housing and including the metallic wiring, the motor rotor provided in the housing and configured to rotate together with the rotational shaft, the first inverter configured to control the power supplied to the first motor stator, the second inverter configured to control the power supplied to the second motor stator, the control unit portion including the calculation circuit, the first inverter control portion provided in the control unit portion and configured to output the control signal for controlling the driving of the first inverter, the second inverter control portion provided in the control unit portion and configured to output the control signal for controlling the driving of the second inverter, and the short circuit determination portion provided in the control unit portion and configured to, when the power is supplied only to one of the first inverter and the second inverter by the first inverter control portion or the second inverter control portion, determine the presence/absence of the short circuit between the first motor stator and the second motor stator based on the conductive state of the other of the first motor stator and the second motor stator that is controlled by the other of the first inverter and the second inverter.

Therefore, when the short circuit failure has occurred between the motors in the redundant systems, the present embodiment can detect this abnormality quickly and also issue a warning to the driver appropriately, thereby improving the safety of the power steering apparatus. Therefore, the present embodiment can provide a motor actuator capable of shifting to an optimum system state and a power steering apparatus using this motor actuator.

Second Embodiment

The present embodiment will be described as an embodiment in a case where two CPUs and two inverters and motors are used in the EPS system.

Figure 8:
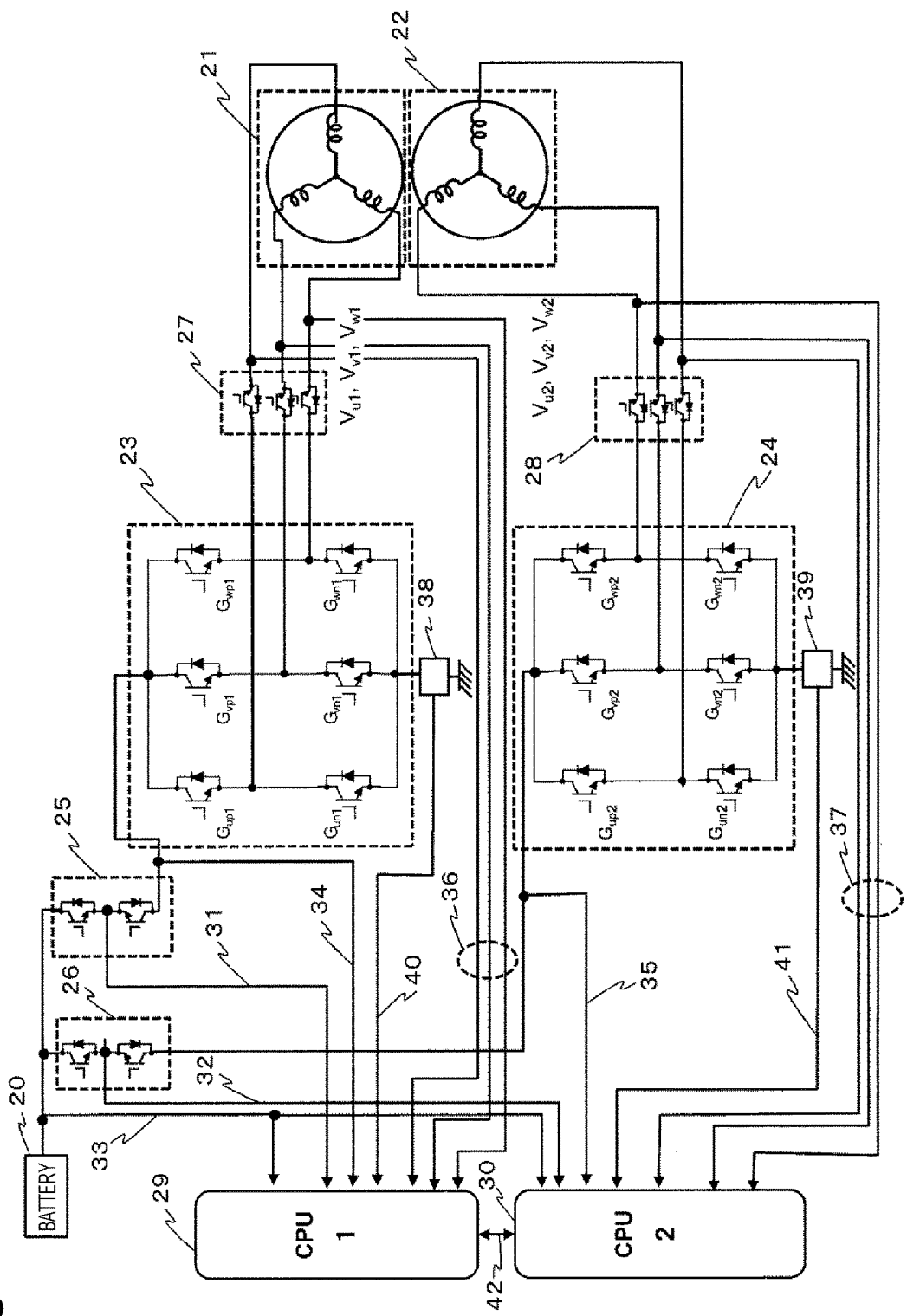
FIG. 8 is a block configuration diagram of a motor and an ECU in a case where two CPUs and two inverters and motors are used with respect to an EPS system according to a second embodiment.

FIG. 8 is a block configuration diagram of a motor and an ECU in the case where two CPUs and two inverters and motors are used in an EPS system according to the present embodiment. In FIG. 8, components labeled the same reference numerals as FIG. 2 have similar functions thereto, and descriptions thereof will be omitted here. Differences from FIG. 2 are that a CPU 2 (30) is added, the voltage and the current of the motor 1 (21) and the inverter 1 (23) are monitored by the CPU 1 (29), the voltage and the current of the motor 2 (22) and the inverter 2 (24) are monitored by the CPU 2 (30) individually, and inter-CPU communication 42 is carried out between the CPU 1 (29) and the CPU 2 (30).

Figure 9:
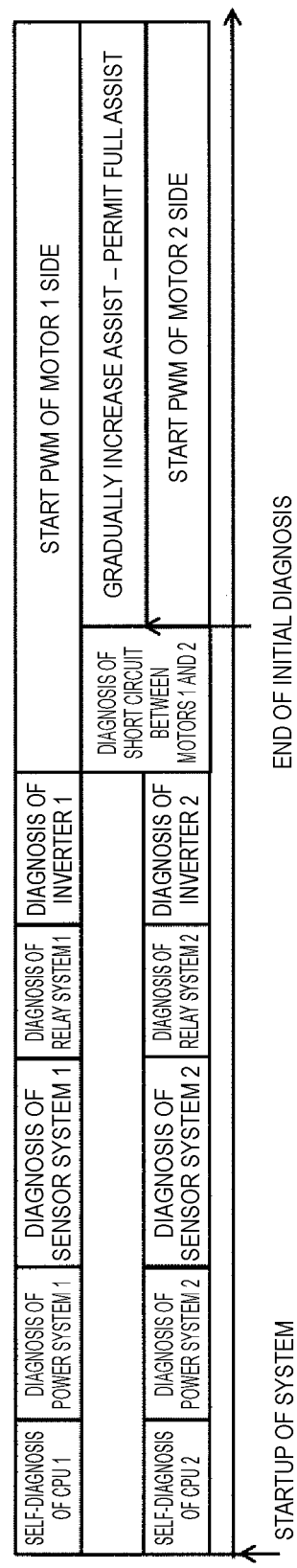
FIG. 9 is a timing configuration diagram illustrating a diagnosis sequence from the startup of the system to the start of the full-assist control according to the second embodiment.

FIG. 9 is a timing configuration diagram illustrating a diagnosis sequence from the startup of the system to the start of the full-assist control according to the present embodiment. In FIG. 9, when the system is started up, first, the CPUs 1 and 2 carry out their respective self-diagnoses in parallel, and, subsequently, the CPUs 1 and 2 each carry out the diagnosis of the power source system, the diagnosis of the sensor system, the diagnosis of the relay system, and the diagnosis of the inverter in series. After that, the ECU carries out the diagnosis of the short circuit between the motors 1 and 2. Details of the diagnosis of the short circuit are similar to the first embodiment. At the time of the diagnosis of the short circuit, first, the ECU starts the PWM driving of the motor 1 by the inverter 1 on the motor 1 side while refraining from driving the inverter 2 on the motor 2 side. This operation causes an increase in the voltage of the three-phase voltage monitor on the motor 2 side if the short circuit has occurred between the coils, and therefore the ECU can detect the short circuit. Upon completing the diagnosis of the short circuit between the motors 1 and 2 by the above-described processing, the ECU starts the PWM driving of the motor 2 by the inverter 2 on the motor 2 side and gradually increases the assist of the EPS system, thereby starting the full-assist control.

In this manner, when the inverter 2 starts the PWM driving of the motor 2 after a predetermined time period has elapsed since the inverter 1 starts the PWM driving of the motor 1, the ECU carries out the diagnosis of the short circuit between the motors 1 and 2 during this predetermined time period. Then, if performing the PWM driving control of the motors 1 and 2 by the inverters 1 and 2 while inserting a time lag therebetween, the ECU can realize the diagnosis of the short circuit between the motors 1 and 2 by carrying out the inter-CPU communication 42 between the CPU 1 (29) and the CPU 2 (30).

Third Embodiment

The present embodiment will be described as an embodiment in a case where the diagnosis of the short circuit between the motors 1 and 2 is carried out during the diagnoses of the inverters 1 and 2 in parallel therewith.

Figure 10:
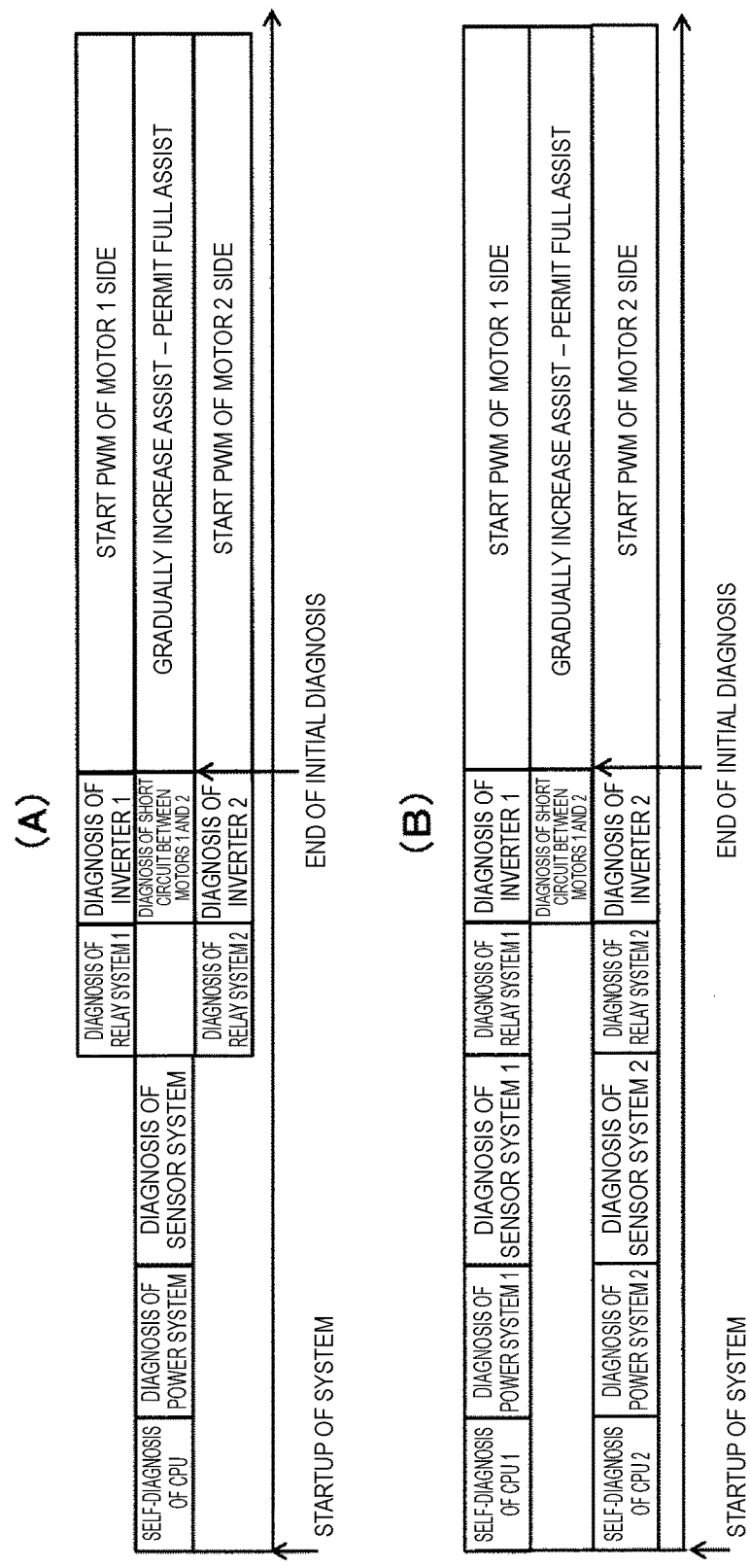
FIG. 10 is a timing configuration diagram illustrating a diagnosis sequence from the startup of the system to the start of the full-assist control according to a third embodiment.

FIG. 10 is a timing configuration diagram illustrating a diagnosis sequence from the startup of the system to the start of the full-assist control according to the present embodiment. FIG. 10(A) illustrates the diagnosis sequence in the case where one CPU is used, and FIG. 10(B) illustrates the diagnosis in the case where two CPUs are used. Both FIGS. 10(A) and 10(B) are similar to the contents described with reference to FIGS. 3 and as far as the diagnosis of the relay system, and therefore descriptions thereof will be omitted here. The present embodiment is characterized in that the diagnosis of the short circuit between the motors 1 and 2 is carried out during the diagnoses of the inverters 1 and 2 in parallel therewith. By this sequence, the present embodiment can determine the presence/absence of the short circuit for a further short time compared to the configuration illustrated in FIG. 3(B) and FIG. 9. Further, the present embodiment can improve the safety by determining the presence/absence of the short circuit during the execution of the initial diagnosis before the motor control is started.

Figure 11:
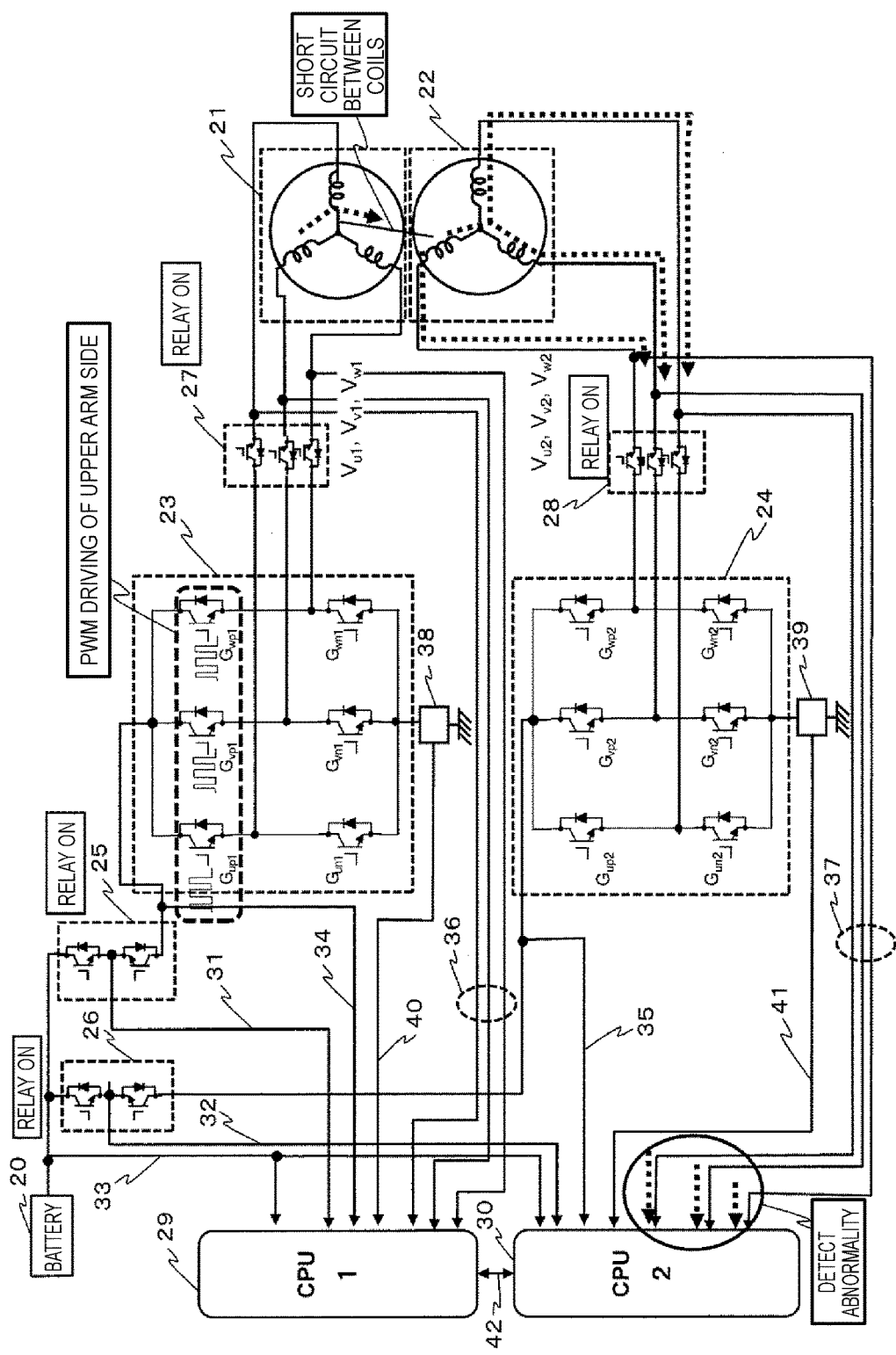
FIG. 11 is a block configuration diagram of the motor and the ECU that illustrates an abnormality detection mechanism by the three-phase voltage monitor according to the third embodiment.

FIG. 11 is a block configuration diagram of the motor and the ECU that illustrates the abnormality detection mechanism by the three-phase voltage monitor according to the present embodiment. FIG. 11 illustrates the abnormality detection mechanism in the case where two CPUs are used like the second embodiment. In FIG. 11, to carry out the diagnoses of the inverters 1 and 2, the ECU turns on each of the FS relay 1 (25) and the FS relay 2 (26) to set the current supply from the battery 20 to the inverter 1 (23) and the inverter 2 (24) into the conductive state, and first, drives the upper arm side of the inverter 1 (23) by the PWM driving. Then, the ECU turns on the motor relay 1 (27) to thus create the state in which the voltage is applied to the motor 1 (21), while refraining from driving the inverter 2 (24) by the PWM driving to thus maintain the state in which no voltage is applied to the power supply phase of the motor 2 (22). Then, if the motor actuator operates normally without the short circuit occurring between the motors, no voltage is generated on the three-phase voltage monitor 2 (37) on the motor 2 side. However, if the short circuit has occurred between the motors, power is also supplied to the motor 2 side, and therefore the voltage of the three-phase voltage monitor 2 (37) increases. Therefore, the ECU can carry out the diagnosis of the short circuit between the motors by observing this three-phase voltage monitor 2 (37).

In this manner, during the diagnoses of the inverters, when driving the upper arm side of only one of the inverters by the PWM driving, the ECU can determine the presence/absence of the short circuit between the motors when the voltage value of the three-phase voltage monitor is detected from the other of the motors, i.e., by detecting that the motor actuator is in such a state that power is also supplied to the other of the motors.

Driving the upper arm side of the inverter 1 (23) by the PWM driving and turning off the PWM driving on the lower arm side of the inverter 1 (23) leads to an increase in a power supply amount delivered around to the other of the inverters, and therefore can improve the accuracy of determining the short circuit.

Figure 12:
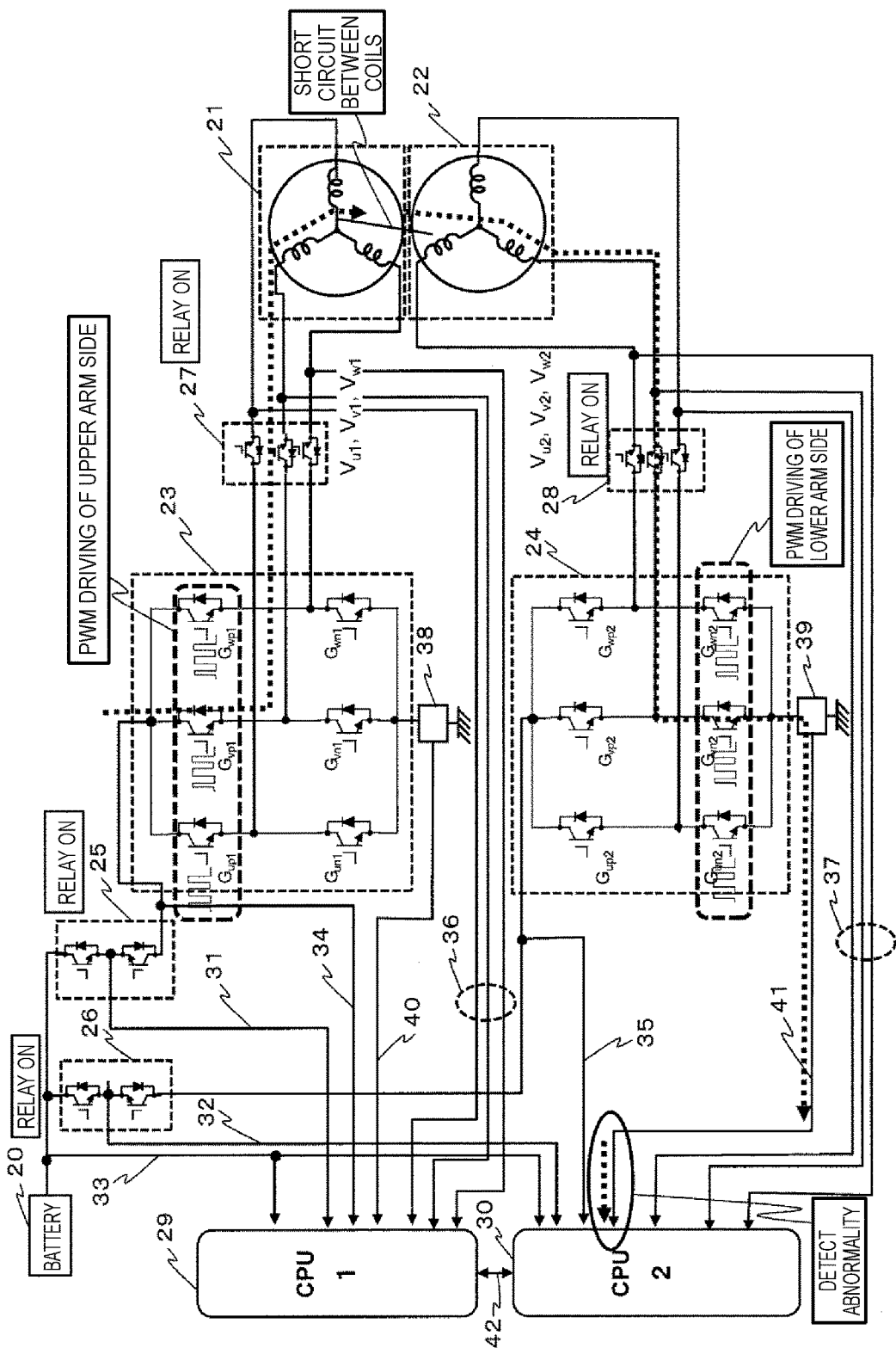
FIG. 12 is a block configuration diagram of the motor and the ECU that illustrates an abnormality detection mechanism by the motor current monitor according to the third embodiment.

FIG. 12 is a block configuration diagram of the motor and the ECU that illustrates the abnormality detection mechanism by the motor current monitor according to the present embodiment. FIG. 12 illustrates the abnormality detection mechanism in the case where two CPUs are used like the second embodiment. In FIG. 12, to carry out the diagnosis of the inverters 1 and 2, the ECU turns on each of the FS relay 1 (25) and the FS relay 2 (26) to set the current supply from the battery 20 to the inverter 1 (23) and the inverter 2 (24) into the conductive state, and first, drives the upper arm side of the inverter 1 (23) by the PWM driving. At this time, if the motor actuator operates normally without the short circuit occurring between the motors, the motor 2 is not driven by the inverter 2 (24) and therefore no current is detected by the motor 2 current monitor 41. On the other hand, if the short circuit has occurred between the motors, the current also flows on the motor 2 side, and is detected by the motor current sensor 2 (39) by driving the lower arm drive element on the inverter 2 (24) side by the PWM driving. Then, the current of the motor 2 current monitor 41 increases. Therefore, the ECU can carry out the diagnosis of the short circuit between the motors by observing this motor 2 current monitor 41.

In this manner, the ECU can carry out the diagnosis of the short circuit between the motors by detecting the motor 2 current monitor 41 while driving the upper arm side of only one of the inverters by the PWM driving and driving the lower arm side of the other of the inverters by the PWM driving during the diagnoses of the inverters.

Fourth Embodiment

The present embodiment will be described as an example in which, when a failure has already occurred and the inverter and the motor in one of the systems are in a shutoff state, the short circuit between the motors can be detected even during control of backup by the remaining system.

Figure 13:
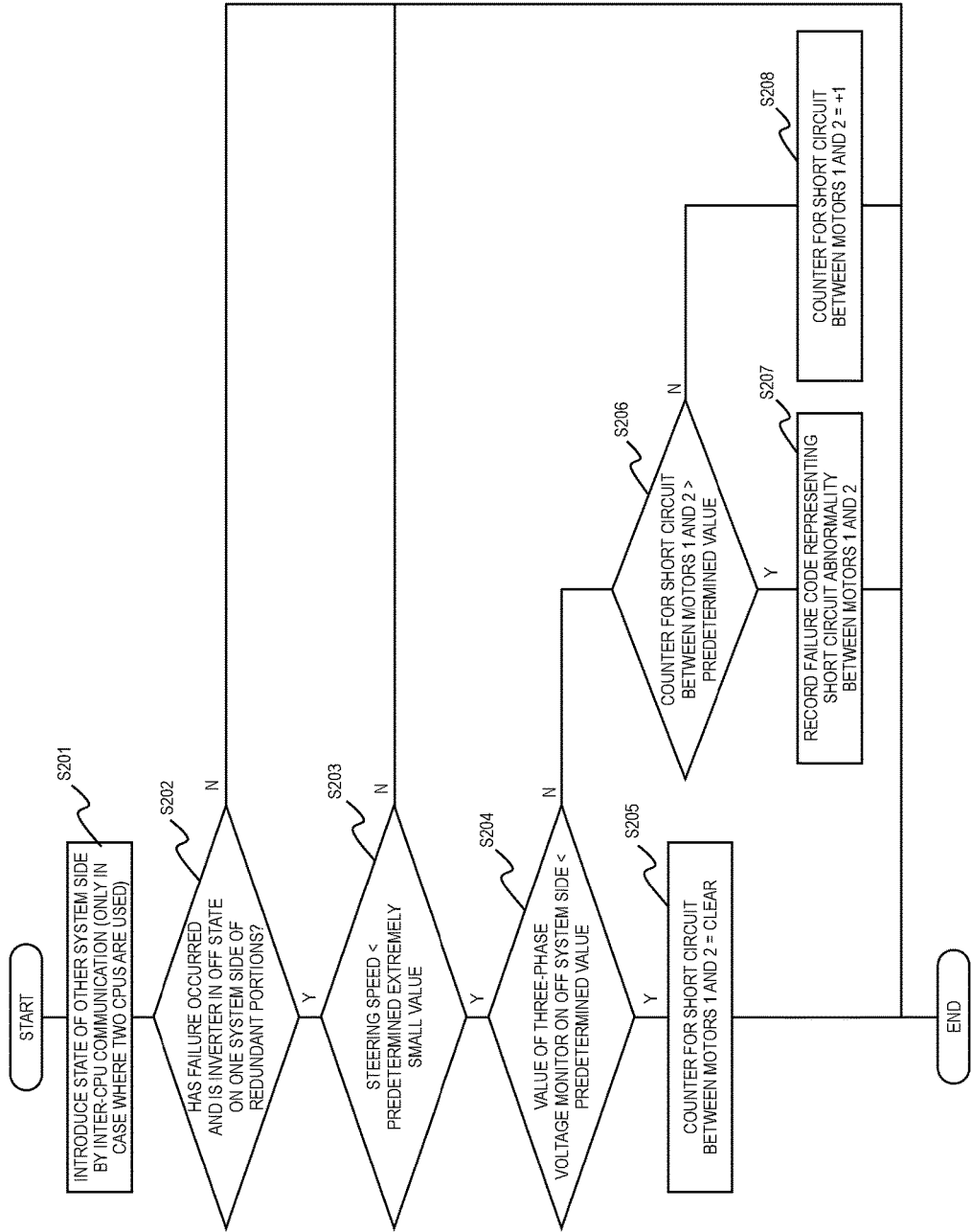
FIG. 13 is a processing flowchart of an abnormality detection mechanism according to a fourth embodiment.

FIG. 13 is a processing flowchart of the abnormality detection mechanism according to the present embodiment. In FIG. 13, first, in S201, the ECU introduces the state of the other of the systems by the inter-CPU communication. This processing is performed only in the case where two CPUs are used, and is not necessary in the case where one CPU is used. Then, in S202, the ECU determines whether a failure has occurred in one of the systems and the inverter is in the OFF state on the one side. If the inverter is not in the OFF state, the ECU ends the processing. If the inverter is in the OFF state, in S203, the ECU determines whether the steering speed is lower than a predetermined value. Then, if the steering speed is higher than the predetermined value, the ECU determines that the surge voltage is generated due to the rotation of the motor, and then ends the processing assuming that this timing is unsuitable for the diagnosis of the short circuit between the motors.

If the steering speed is lower than the predetermined value, in S204, the ECU determines whether the three-phase voltage monitor value on the OFF system side exceeds a predetermined value. If the steering speed is higher than the predetermined value, the ECU determines that the short circuit has occurred between the motors. Then, in S206, the ECU determines whether the counter for the short circuit between the motors 1 and 2 exceeds a predetermined value. If this counter exceeds the predetermined value, in S207, the ECU records the failure code indicating the short circuit abnormality between the motors 1 and 2, and then ends the processing. If the counter for the short circuit between the motors 1 and 2 does not exceed the predetermined value in S206, the ECU determines that the abnormality is being detected. Then, in S208, the ECU increments the counter for the short circuit between the motors 1 and 2 by one, and then ends processing.

If the three-phase voltage monitor value on the OFF system side does not exceed the predetermined value in S204, the ECU determines the normality. Then, in S205, the ECU clears the counter for the short circuit between the motors 1 and 2, and then ends the processing.

In this manner, this configuration allows the short circuit between the motors to be detected even during the operation/control of the backup by the remaining system.

Having described the embodiments, the present invention is not limited to the above-described embodiment, and includes various modifications. For example, the above-described embodiments have been described in detail to facilitate better understanding of the present invention, and the present invention is not necessarily limited to the configurations including all of the described features. Further, a part of the configuration of some embodiment can be replaced with the configuration of another embodiment, and some embodiment can also be implemented with a configuration of another embodiment added to the configuration of this embodiment. Further, the individual components described in the claims and the specification can be arbitrarily combined or omitted within a range that allows them to remain capable of achieving at least a part of the above-described objects or producing at least a part of the above-described advantageous effects.

The present application claims priority to Japanese Patent Application No. 2016-49219 filed on Mar. 14, 2016. The entire disclosure of Japanese Patent Application No. 2016-49219 filed on Mar. 14, 2016 including the specification, the claims, the drawings, and the abstract is incorporated herein by reference in its entirety.

REFERENCE SIGN LIST 10 steering torque sensor
11 steering angle sensor
12 rack and pinion gear (R & P gear)
13 motor
14 ECU (Electronic Control Unit)
15 speed reducer
16 rack housing
17 tie rod
20 battery
21 motor 1 (wiring coil 1)
22 motor 2 (wiring coil 2)
23 inverter 1
24 inverter 2
25 fail-safe (FS) relay 1
26 fail-safe (FS) relay 2
27 motor relay 1
28 motor relay 2
29 CPU 1 (CPU)
30 CPU 2
31 FS relay 1 intermediate voltage monitor
32 FS relay 2 intermediate voltage monitor
33 battery voltage monitor
34 inverter 1 upstream voltage monitor
35 inverter 2 upstream voltage monitor
36 three-phase voltage monitor 1
37 three-phase voltage monitor 2
38 motor current sensor 1
39 motor current sensor 2
40 motor 1 current monitor
41 motor 2 current monitor
42 inter-CPU communication

The invention claimed is:

1. A motor actuator comprising:
a housing rotatably supporting a rotational shaft;
a first motor stator provided in the housing and including a metallic wiring;
a second motor stator provided in the housing and including a metallic wiring;
a motor rotor provided in the housing and configured to rotate together with the rotational shaft;
a first inverter circuit configured to control power supplied to the first motor stator;
a second inverter circuit configured to control power supplied to the second motor stator; and
a control unit portion including a calculation circuit,
wherein the control unit portion includes:
a first inverter control portion configured to output a control signal for controlling driving of the first inverter circuit;
a second inverter control portion configured to output a control signal for controlling driving of the second inverter circuit; and
a short circuit determination portion configured to, when the power is supplied only to one inverter circuit of the first inverter circuit and the second inverter circuit by the first inverter control portion or the second inverter control portion, determine presence/absence of a short circuit between the first motor stator and the second motor stator based on a conductive state of the other inverter circuit of the first inverter circuit and the second inverter circuit.

2. The motor actuator according to claim 1, wherein, when the second inverter control portion starts controlling the driving of the second inverter circuit after a predetermined time period has elapsed since the first inverter control portion starts controlling the driving of the first inverter circuit, the short circuit determination portion determines the presence/absence of the short circuit during the predetermined time period.

3. The motor actuator according to claim 2, wherein the control unit portion includes an initial diagnosis portion configured to carry out an initial diagnosis of diagnosing presence/absence of abnormality of each of the first inverter circuit and the second inverter circuit, and
wherein the short circuit determination portion determines the presence/absence of the short circuit after the initial diagnosis is ended.

4. The motor actuator according to claim 3, wherein the control unit portion includes a supply power limit portion configured to perform limiter processing for limiting an upper limit value of an amount of the power supply to the first motor stator and the second motor stator, and
wherein the short circuit determination portion determines the presence/absence of the short circuit while the power limit portion is performing the limiter processing.

5. The motor actuator according to claim 1, wherein the first motor stator and the second motor stator each include a plurality of power supply phases,
wherein the first inverter control portion and the second inverter control portion control the driving of the first inverter circuit and the second inverter circuit, respectively, in such a manner that the first inverter circuit and the second inverter circuit each selectively supply the power to the plurality of power supply phases, and
wherein the short circuit determination portion determines the presence/absence of the short circuit based on a voltage of the power supply phase of the other inverter circuit.

6. The motor actuator according to claim 5, wherein the first inverter circuit and the second inverter circuit each include switching elements configured to control the power supply to the plurality of power supply phases, and
wherein the short circuit determination portion determines the presence/absence of the short circuit when all of the switching elements of the other inverter circuit are in OFF states.

7. The motor actuator according to claim 1, further comprising:
a first current detection portion configured to detect a direct-current bus current of the first inverter circuit; and
a second current detection portion configured to detect a direct-current bus current of the second inverter circuit,
wherein the first motor stator and the second motor stator each include a plurality of power supply phases,
wherein the first inverter control portion and the second inverter control portion control the driving of the first inverter circuit and the second inverter circuit, respectively, in such a manner that the first inverter circuit and the second inverter circuit each selectively supply the power to the plurality of power supply phases, wherein the first inverter circuit and the second inverter circuit each include switching elements configured to control the power supply to the plurality of power supply phases, wherein the switching elements include an upstream-side switching element and a downstream-side switching element for each of the plurality of power supply phases, wherein the first inverter circuit and the second inverter circuit form a bridge circuit, wherein the switching elements control switching of power supply states of the plurality of power supply phases by switching ON states and OFF states of the upstream-side and downstream-side switching elements, and wherein, when the downstream-side switching element of the other inverter circuit is in the ON state, the short circuit determination portion determines the presence/absence of the short circuit based on a result of detection by one of the first current detection portion and the second current detection portion that detects the direct-current bus current of the other inverter circuit.

8. The motor actuator according to claim 7, wherein the short circuit determination portion determines the presence/absence of the short circuit when the upstream-side switching element of the one inverter circuit is turned on and the downstream-side switching element of the one inverter circuit is turned off.

9. The motor actuator according to claim 8, wherein the driving of the first inverter circuit and the second inverter circuit is controlled by PWM control, and wherein the short circuit determination portion determines the presence/absence of the short circuit when a PWM duty value of the other inverter circuit is lower than a PWM duty value of the one inverter circuit.

10. The motor actuator according to claim 1, wherein the control unit portion includes an initial diagnosis portion configured to carry out an initial diagnosis of diagnosing presence/absence of abnormality of each of the first inverter circuit and the second inverter circuit, and wherein the short circuit determination portion determines the presence/absence of the short circuit with a voltage applied to each of the first motor stator and the second motor stator during the initial diagnosis.

11. A power steering apparatus comprising:
a steering mechanism configured to turn a turning target wheel according to a steering operation performed on a steering wheel;
an electric motor including a housing, a first motor stator provided in the housing and including a metallic wiring, a second motor stator provided in the housing and including a metallic wiring, a motor rotor provided in the housing, and a motor shaft configured to rotate together with the motor rotor, the electric motor being configured to provide a steering force to the steering mechanism via the motor shaft; and
a motor control device configured to control driving of the electric motor,
wherein the motor control device includes:
a first inverter circuit configured to control power supplied to the first motor stator;
a second inverter circuit configured to control power supplied to the second motor stator; and
a control unit portion including a calculation circuit,
wherein the control unit portion includes:

a first inverter control portion configured to output a control signal for controlling driving of the first inverter circuit;
a second inverter control portion configured to output a control signal for controlling driving of the second inverter circuit; and
a short circuit determination portion configured to, when the power is supplied only to one inverter circuit of the first inverter circuit and the second inverter circuit by the first inverter control portion or the second inverter control portion, determine presence/absence of a short circuit between the first motor stator and the second motor stator based on a conductive state of the other inverter circuit of the first inverter circuit and the second inverter circuit.

12. The power steering apparatus according to claim 11, wherein, when the second inverter control portion starts controlling the driving of the second inverter circuit after a predetermined time period has elapsed since the first inverter control portion starts controlling the driving of the first inverter circuit, the short circuit determination portion determines the presence/absence of the short circuit during the predetermined time period.

13. The power steering apparatus according to claim 12, wherein the control unit portion includes an initial diagnosis portion configured to carry out an initial diagnosis of diagnosing presence/absence of abnormality of each of the first inverter circuit and the second inverter circuit, and wherein the short circuit determination portion determines the presence/absence of the short circuit after the initial diagnosis is ended.

14. The power steering apparatus according to claim 13, wherein the control unit portion includes a supply power limit portion configured to perform limiter processing for limiting an upper limit value of an amount of the power supply to the first motor stator and the second motor stator, and wherein the short circuit determination portion determines the presence/absence of the short circuit while the power limit portion is performing the limiter processing.

15. The power steering apparatus according to claim 11, wherein the first motor stator and the second motor stator each include a plurality of power supply phases, wherein the first inverter control portion and the second inverter control portion control the driving of the first inverter circuit and the second inverter circuit, respectively, in such a manner that the first inverter circuit and the second inverter circuit each selectively supply the power to the plurality of power supply phases, and wherein the short circuit determination portion determines the presence/absence of the short circuit based on a voltage of the power supply phase of the other inverter circuit.

16. The power steering apparatus according to claim 15, wherein the first inverter circuit and the second inverter circuit each include switching elements configured to control the power supply to the plurality of power supply phases, and wherein the short circuit determination portion determines the presence/absence of the short circuit when all of the switching elements of the other inverter circuit are in OFF states.

17. The power steering apparatus according to claim 11, further comprising:

a first current detection portion configured to detect a direct-current bus current of the first inverter circuit; and a second current detection portion configured to detect a direct-current bus current of the second inverter circuit, wherein the first motor stator and the second motor stator each include a plurality of power supply phases, wherein the first inverter control portion and the second inverter control portion control the driving of the first inverter circuit and the second inverter circuit, respectively, in such a manner that the first inverter circuit and the second inverter circuit each selectively supply the power to the plurality of power supply phases, wherein the first inverter circuit and the second inverter circuit each include switching elements configured to control the power supply to the plurality of power supply phases, wherein the switching elements include an upstream-side switching element and a downstream-side switching element for each of the plurality of power supply phases, wherein the first inverter circuit and the second inverter circuit form a bridge circuit, wherein the switching elements control switching of power supply states of the plurality of power supply phases by switching ON states and OFF states of the upstream-side and downstream-side switching elements, and wherein, when the downstream-side switching element of the other inverter circuit is in the ON state, the short circuit determination portion determines the presence/absence of the short circuit based on a result of detection by one of the first current detection portion and the second current detection portion that detects a direct-current bus current of the other inverter circuit.

18. The power steering apparatus according to claim 17, wherein the short circuit determination portion determines the presence/absence of the short circuit when the upstream-side switching element of the one inverter circuit is turned on and the downstream-side switching element of the one inverter circuit is turned off.

19. The power steering apparatus according to claim 18, wherein the driving of the first inverter circuit and the second inverter circuit is controlled by PWM control, and wherein the short circuit determination portion determines the presence/absence of the short circuit when a PWM duty value of the other inverter circuit is lower than a PWM duty value of the one inverter circuit.

20. The power steering apparatus according to claim 11, wherein the control unit portion includes an initial diagnosis portion configured to carry out an initial diagnosis of diagnosing presence/absence of abnormality of each of the first inverter circuit and the second inverter circuit, and wherein the short circuit determination portion determines the presence/absence of the short circuit with a voltage applied to each of the first motor stator and the second motor stator during the initial diagnosis.

* * * * *